(12) United States Patent
Lin et al.

(10) Patent No.: US 10,504,880 B2
(45) Date of Patent: Dec. 10, 2019

(54) METHOD OF FORMING SEMICONDCUTOR DEVICE PACKAGE

(71) Applicant: Taiwan Semiconductor Manufacturing Co., Ltd., Hsinchu (TW)

(72) Inventors: Po-Yao Lin, Hsinchu County (TW); Cheng-Yi Hong, Hsinchu (TW); Feng-Cheng Hsu, New Taipei (TW); Shuo-Mao Chen, New Taipei (TW); Shin-Puu Jeng, Hsinchu (TW); Shu-Shen Yeh, Taoyuan (TW); Kuang-Chun Lee, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/396,765

(22) Filed: Apr. 29, 2019

(65) Prior Publication Data
US 2019/0252363 A1 Aug. 15, 2019

Related U.S. Application Data

(62) Division of application No. 15/854,762, filed on Dec. 27, 2017, now Pat. No. 10,276,551.

(Continued)

(51) Int. Cl.
*H01L 21/44* (2006.01)
*H01L 21/48* (2006.01)
(Continued)

(52) U.S. Cl.
CPC .......... *H01L 25/18* (2013.01); *H01L 21/4857* (2013.01); *H01L 21/563* (2013.01); *H01L 23/24* (2013.01); *H01L 23/3128* (2013.01); *H01L 23/5383* (2013.01); *H01L 25/50* (2013.01); *H01L 23/3731* (2013.01); *H01L 23/3736* (2013.01); *H01L 23/3738* (2013.01); *H01L 2224/16225* (2013.01); *H01L 2224/32225* (2013.01); *H01L 2224/73204* (2013.01); *H01L 2224/73253* (2013.01); *H01L 2924/15311* (2013.01); *H01L 2924/18161* (2013.01)

(58) Field of Classification Search
CPC ............... H01L 21/4857; H01L 21/563; H01L 23/5383; H01L 25/18
USPC .......................................... 438/109, 112, 127
See application file for complete search history.

(56) References Cited

U.S. PATENT DOCUMENTS

| | | | |
|---|---|---|---|
| 2015/0048500 A1* | 2/2015 | Yu | H01L 25/50 257/737 |
| 2016/0190028 A1* | 6/2016 | Shi | H01L 24/97 257/738 |
| 2018/0261554 A1* | 9/2018 | Huang | H01L 23/04 |

* cited by examiner

*Primary Examiner* — David S Blum
(74) *Attorney, Agent, or Firm* — JCIPRNET

(57) ABSTRACT

A method of forming a semiconductor device package includes the following steps. A redistribution structure is formed on a carrier. A plurality of second semiconductor devices are disposed on the redistribution structure. At least one warpage adjusting component is disposed on at least one of the second semiconductor devices. A first semiconductor device is disposed on the redistribution structure. An encapsulating material is formed on the redistribution structure to encapsulate the first semiconductor device, the second semiconductor devices and the warpage adjusting component. The carrier is removed to reveal a bottom surface of the redistribution structure. A plurality of electrical terminals are formed on the bottom surface of the redistribution structure.

20 Claims, 17 Drawing Sheets

Related U.S. Application Data

(60) Provisional application No. 62/528,160, filed on Jul. 3, 2017.

(51) Int. Cl.
*H01L 21/50* (2006.01)
*H01L 25/18* (2006.01)
*H01L 21/56* (2006.01)
*H01L 23/24* (2006.01)
*H01L 25/00* (2006.01)
*H01L 23/31* (2006.01)
*H01L 23/538* (2006.01)
*H01L 23/373* (2006.01)

METHOD OF FORMING SEMICONDCUTOR DEVICE PACKAGE

CROSS-REFERENCE TO RELATED APPLICATION

This is a divisional application of patent application Ser. No. 15/854,762, filed on Dec. 27, 2017, now U.S. Pat. No. 10,276,551, which claims the priority benefit of U.S. provisional application Ser No. 62/528,160, filed on Jul. 03, 2017 and is now allowed. The entirety of each of the above-mentioned patent applications is hereby incorporated by reference herein and made a part of this specification.

BACKGROUND

In the packaging of integrated circuits, device dies, which may be stacked vertically as well as horizontally, are packaged onto redistribution structures. The device dies may be bonded onto one side of a redistribution structure using flip chip bonding, and a reflow is performed to melt the solder balls that interconnect the dies and the redistribution structure. Then, a molding compound is applied on the package, with the molding compound covering the device die and the solder balls.

However, there is significant mismatch between the Coefficients of Thermal Expansion (CTEs) of the materials in the packages. For example, the redistribution structures and the molding compound have CTEs that are much higher than that of the device dies. Accordingly, in the resulting package, there is a significant warpage. The warpage in the package substrates may cause irregular joints and/or bump cracks. The warpage may be further worsened by the asymmetrical arrangement of device dies over the redistribution structures. As a result, the yield of the packaging process is adversely affected.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
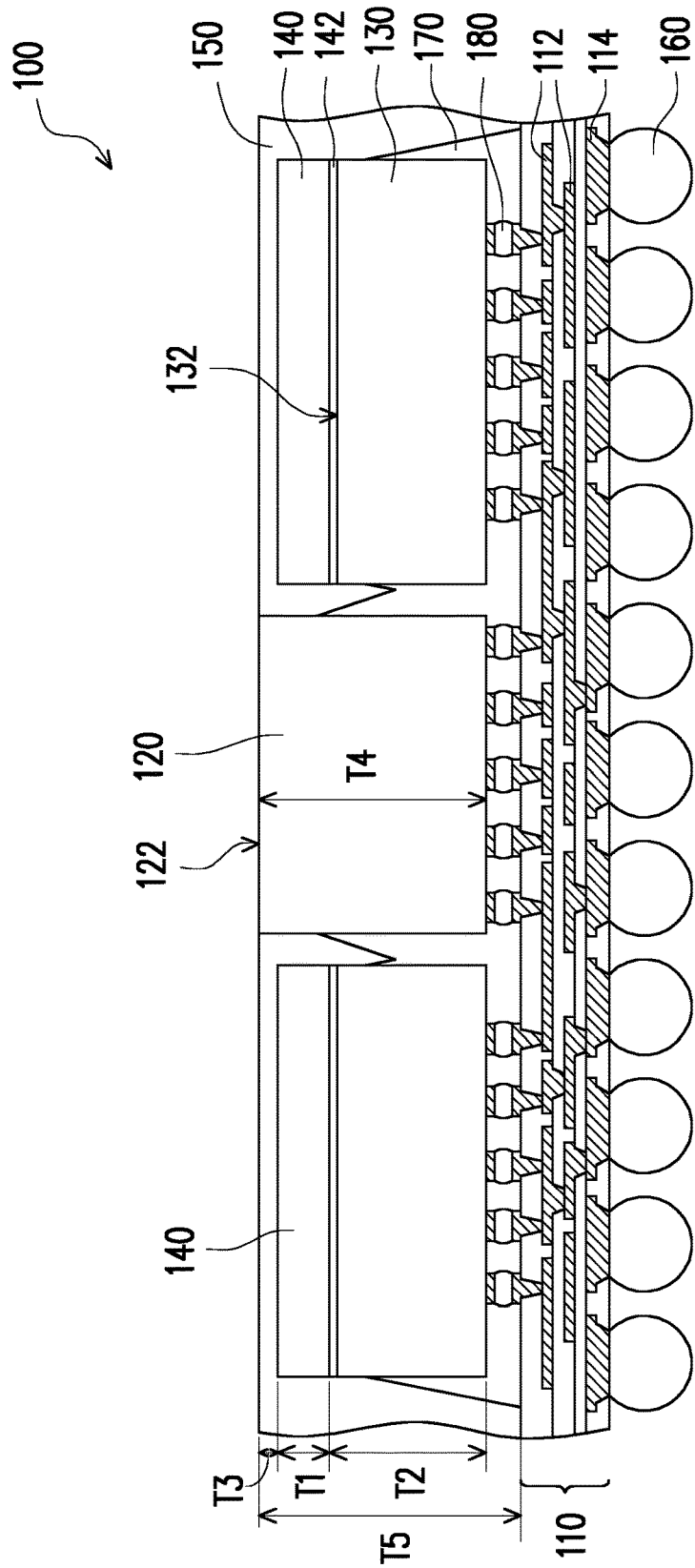
FIG. 1 illustrates a cross sectional view of a semiconductor device package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 2:
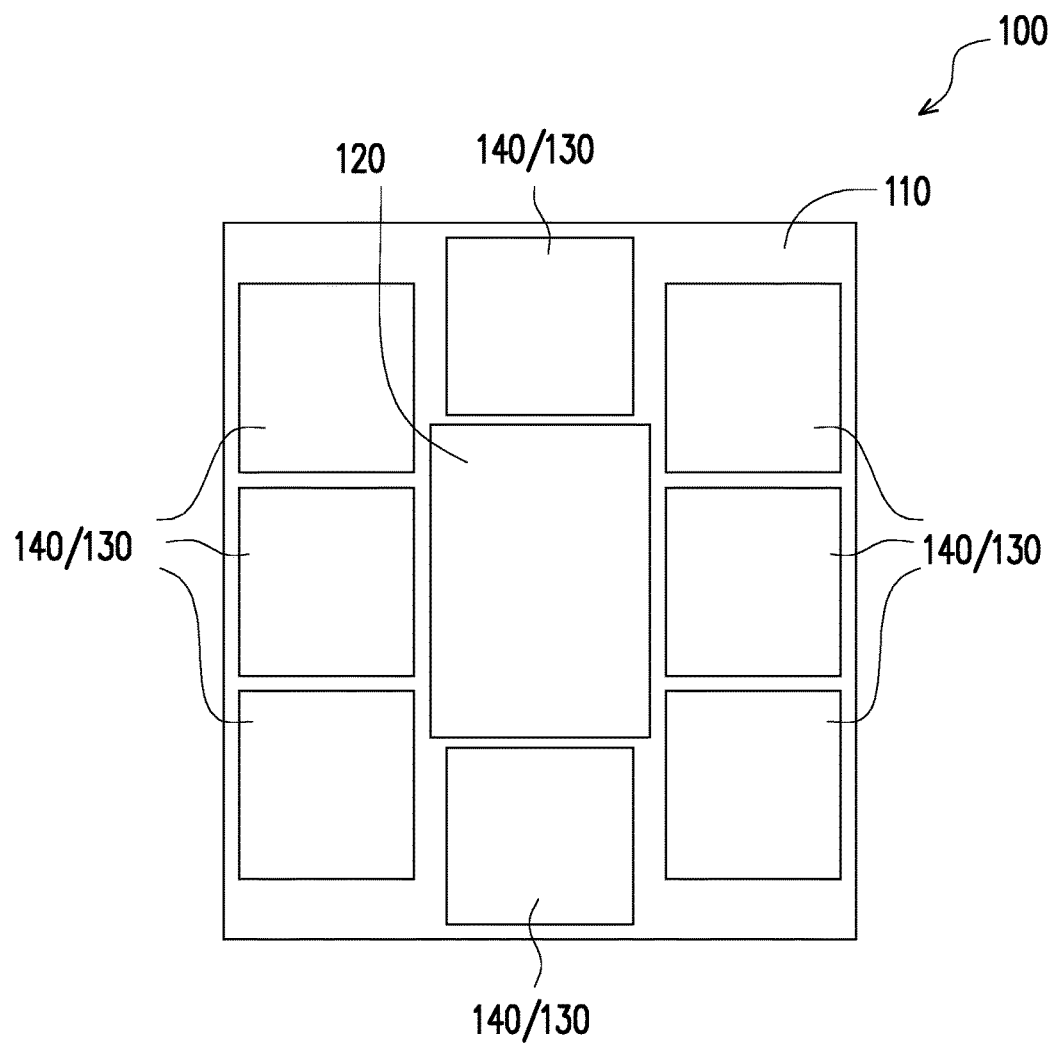
FIG. 2 illustrates a top view of a semiconductor device package according to some exemplary embodiments of the present disclosure.
Figure 3:
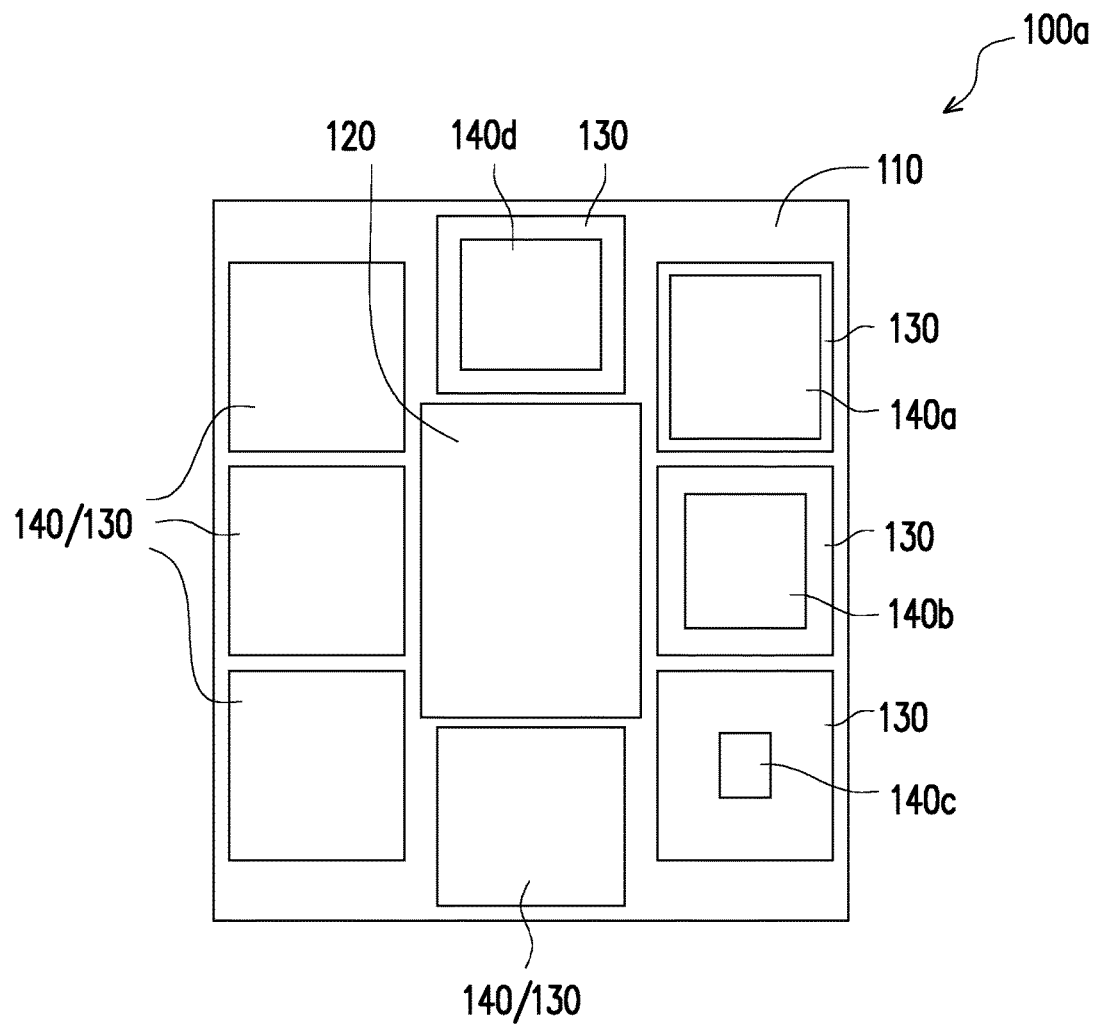
FIG. 3 illustrates a top view of a semiconductor device package according to some exemplary embodiments of the present disclosure.

Various embodiments described below relate to reducing warpage in packages formed using multi-chip packaging processes. FIG. 1 illustrates a cross sectional view of a semiconductor device package according to some exemplary embodiments of the present disclosure. FIG. 2 illustrates a top view of a semiconductor device package according to some exemplary embodiments of the present disclosure. FIG. 3 illustrates a top view of a semiconductor device package according to some exemplary embodiments of the present disclosure. Referring to FIG. 1 to FIG. 3, in some embodiments, a semiconductor device package 100 includes a redistribution structure 110, a first semiconductor device 120, a plurality of second semiconductor devices 130, at least one warpage adjusting component 140 and an encapsulating material 150. The first semiconductor device 120 and the second semiconductor devices 130 are disposed on the redistribution structure 110, and the second semiconductor devices 130 may surround the first semiconductor device 120 as shown in FIG. 2. In some embodiments, the first semiconductor device 120 and the second semiconductor devices 130 may be bonded to the redistribution structure 110 through a plurality of connectors 180 such as solder joints.

In some embodiments, the first semiconductor device 120 and the second semiconductor devices 130 may be different type of semiconductor devices with different sizes. For example, the first semiconductor device 120 may be a system on chip (SOC), while each of the second semiconductor devices 130 may be a dynamic random access memory (DRAM) chip-scale package (CSP) and electrically connected to the first semiconductor device 120 through the redistribution structure 110. In some embodiments, a thickness T4 of the first semiconductor device 120 is greater than a thickness T2 of each of the second semiconductor devices 130, and the encapsulating material reveals a back surface of the first semiconductor device. In one of the implementations, the thickness T4 of the first semiconductor device 120 may be about 770 µm while the thickness T2 of each of the second semiconductor devices 130 may be about 400 µm, but the disclosure is not limited thereto.

In some embodiments, the at least one warpage adjusting component 140 is disposed on at least one of the second semiconductor devices 130 as shown in FIG. 1, and the encapsulating material 150 encapsulates the first semiconductor device 120, the second semiconductor devices 130 and the warpage adjusting component 140. In some embodiments, the coefficients of thermal expansion (CTE) of the encapsulating material 150 is much higher than CTEs of the first semiconductor device 120 and the second semiconductor devices 130. In addition, in some implementations, the sizes of the first semiconductor device 120 and the second semiconductor devices 130 may be different. For example, a thickness of the first semiconductor device 120 may be greater than a thickness of each of the second semiconductor devices 130 as shown in FIG. 1, and the encapsulating material 150 may reveal a back surface 122 of the first semiconductor device 120 but extending over the second semiconductor devices 130. As such, in the resulting semiconductor device package, there is a significant warpage.

Accordingly, a Young's modulus of the warpage adjusting component 140 is designed to be greater than or equal to a Young's modulus of the encapsulating material 150, and a CTE of the warpage adjusting component 140 is designed to be smaller than a CTE of the encapsulating material 150. Thereby, the warpage adjusting component 140 is configured to be disposed on the second semiconductor devices 130 to reduce CTE mismatch and improve the warpage profile of the resulting semiconductor device package. In one of the implementations, the warpage adjusting component 140 may be a dummy die, which may not perform any electrical functions and electrically isolated from other components (e.g., redistribution structure 110 and/or semiconductor devices 120/130) in the semiconductor device package 100. For example, the warpage adjusting component 140 may be a block of substantially pure silicon to increase the amount of semiconductor material in the package and reduce CTE mismatch in the semiconductor device package 100. In other embodiments, the warpage adjusting component 140 may include other suitable material (e.g., glass) for reducing the effective CTE in the semiconductor device package 100. In addition, by disposing the warpage adjusting frames 140 on the second semiconductor devices 130, the warpage profile of the semiconductor device package 100 can be improved, so there is no need to spare extra space on the redistribution structure for disposing a retaining ring thereon. Thereby, the size of the semiconductor device package 200 can be reduced.

It is noted that the encapsulating materials of the semiconductor device packages 100, 100a are omitted in FIG. 2 and FIG. 3 for better illustrating the disposition of the devices under the encapsulating material. In some embodiments, the semiconductor device package 100 may include more than one warpage adjusting components 140 disposed on at least a set of the second semiconductor devices 130. In the embodiment shown in FIG. 2, the warpage adjusting components 140 are disposed on the second semiconductor devices 130 respectively. The size of the warpage adjusting component 140 may be substantially equal to or even slightly greater than the size of the second semiconductor devices 130, and the sizes of the warpage adjusting components 140 may be substantially the same. Alternatively, in the embodiment shown in FIG. 3, the warpage adjusting components 140 may be disposed on merely a set of the second semiconductor devices 130 (e.g. four of the second semiconductor devices 130 as shown in FIG. 3), and the sizes of the warpage adjusting components 140 are substantially smaller than the sizes of the second semiconductor devices 130. In some embodiments, the size of one of the warpage adjusting components 140 is substantially different from the size of another one of the warpage adjusting components 140. Namely, the sizes of all the warpage adjusting components 140 may not necessarily be the same. In the embodiment of FIG. 3, the sizes of the warpage adjusting components 140a, 140b, 140c, 140d are different from one another.

Referring to FIG. 1, in some embodiments, the thickness T1 of the warpage adjusting component 140 may be substantially equal to or greater than 50 µm, and be smaller than the thickness T5 of the encapsulating material 150 minus the thickness T2 of the second semiconductor device 130. In one of the implementations, the thickness T1 of the warpage adjusting component 140 may range from 50 µm to 400 µm. In some embodiments, the ratio of the thickness T1 of the warpage adjusting component 140 to the thickness T2 of the second semiconductor device 130 may range from 0.1 to 2. In one of the implementations, such ratio may be about 0.2. In some embodiments, the width of the warpage adjusting component 140 may be substantially equal to or greater than 50 µm, and be smaller than the width of the second semiconductor device 130. In one of the implementations, the width of the warpage adjusting component 140 may be about 28.4 µm. In some embodiments, the ratio of the width of the warpage adjusting component 140 to that of the second semiconductor device 130 may range from 0.1 to 1. In one of the implementations, such ratio may be about 1. Namely, the width of the warpage adjusting component 140 and the width of the second semiconductor device 130 may be substantially the same. In some embodiments, the thickness T3 of the encapsulating material 150 above the warpage adjusting component 140 may be greater than 50 µm. In one of the implementations, such thickness T3 may range from 225 µm to 275 µm. Those skilled in the art should understand that sizes and arrangement of the warpage adjusting components 140 shown in the embodiments are merely for illustration. The sizes and the number of the warpage adjusting components 140 may be adjusted according to the warpage simulation result of the semiconductor device packages.

In some embodiment, the warpage simulation for simulating the warpage of the semiconductor device packages 100, 100a may be, for example, finite element method (FEM) numerical modeling, which is used to predict the warpage under different molding process parameters. The size and the number of the warpage adjusting component 140 may be designed according to the result of the warpage simulation to help reduce the warpage of the semiconductor device packages 100, 100a. In some embodiments, each of the warpage adjusting components 140 is attached to the back surface 132 the corresponding second semiconductor device 130 via a die attach film (DAF) 142, wherein the back surface 132 faces away from the redistribution structure 110.

Figure 4:
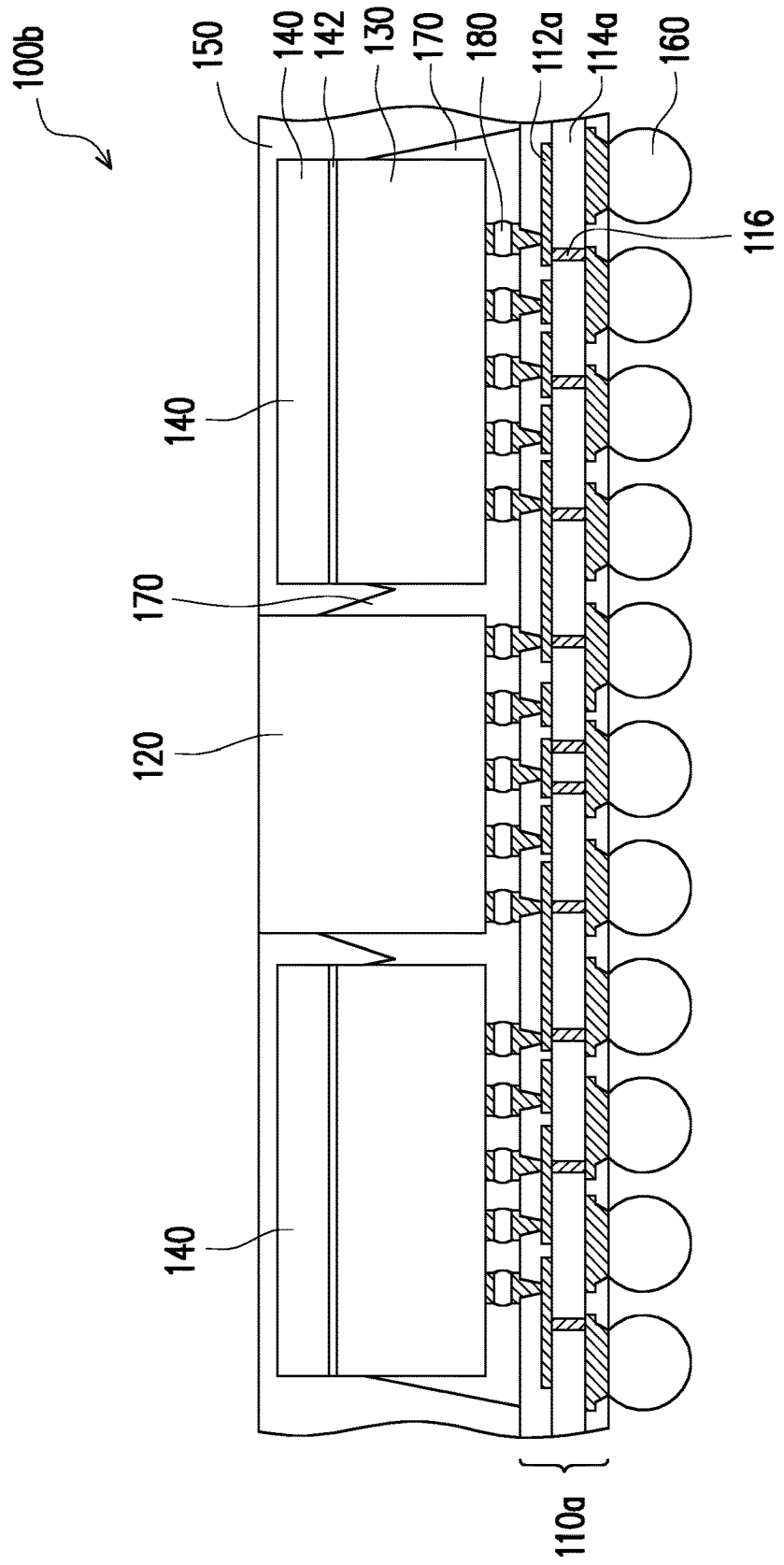
FIG. 4 illustrates a cross sectional view of a semiconductor device package according to some exemplary embodiments of the present disclosure.

In some embodiments, the redistribution structure 110 may be a fan-out redistribution structure 110 including a plurality of fan-out redistribution lines (RDLs) 112 and a plurality of dielectric layers 114 stacked alternately on top of one another, and the encapsulating material 150 is extended over the redistribution structure 110 as shown in FIG. 1. Namely, the semiconductor device package is a multi-chip fan-out package. Alternatively, referring to FIG. 4, in the semiconductor device package 100b, the redistribution structure 110a may be a package substrate 110a, which includes conductive circuits 112a and conductive vias 116 that are used to route electrical signals between opposite sides of a core 114a. The core 114a may use organic materials such as materials that can be easily laminated. In some embodiments, the core 114a may comprise a single-sided or double-sided copper clad laminate, epoxy, resin, glass fiber, molding compound, plastic (such as PolyVinyl-Chloride (PVC), Acrylonitril, Butadiene & Styrene (ABS), Polypropylene (PP), Polyethylene (PE), PolyStyrene (PS), Polymethyl Methacrylate (PMMA), Polyethylene Terephthalate (PET), Polycarbonates (PC), Polyphenylene sulfide (PPS), combinations thereof, multi-layers thereof, and the like. In some embodiments, the conductive vias 116 may extend through the core 114a to provide electrical connection between conductive circuits 112a disposed on either side of core 114a. The conductive vias 116 may be formed as conductive pipes in some embodiments, and the internal volumes of such conductive vias 116 may be filled with dielectric material and/or air gaps.

FIG. 5 to FIG. 11 illustrate cross sectional views of intermediate stages in the manufacturing of a semiconductor device package according to some exemplary embodiments of the present disclosure. In some embodiments, the method of forming the semiconductor device package described above may include the following steps. For purpose of clarity and simplicity, detail description of same or similar features may be omitted, and the same or similar reference numbers denote the same or like components.

Figure 5:
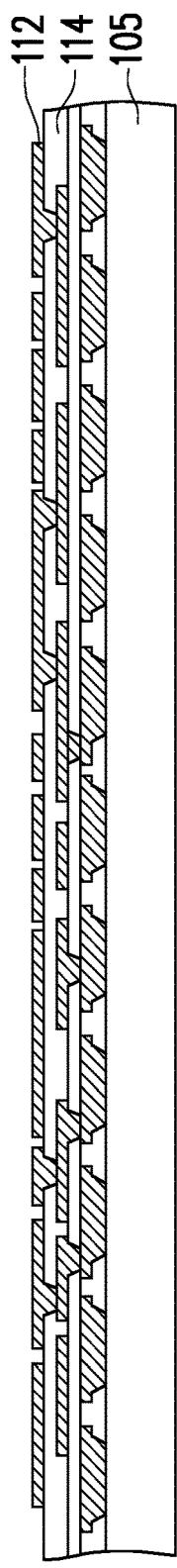
FIG. 5 to FIG. 11 illustrate cross sectional views of intermediate stages in the manufacturing of a semiconductor device package according to some exemplary embodiments of the present disclosure.
Figure 6:
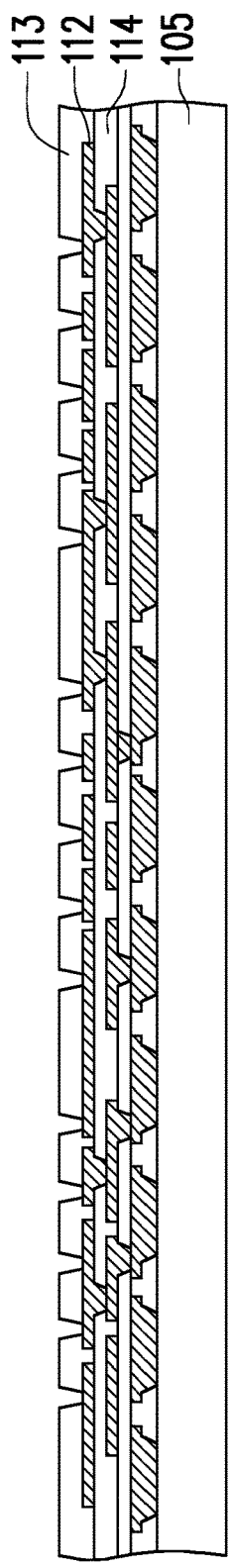
Figure 7:
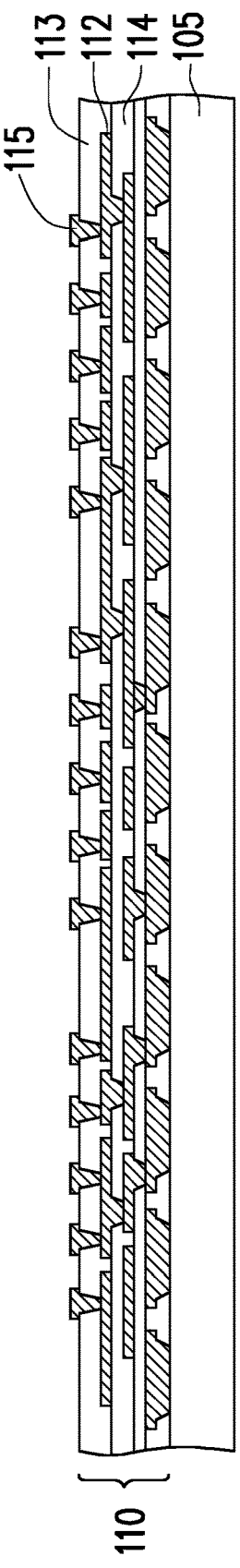

Referring to FIG. 5 to FIG. 7, a redistribution structure 110 may be formed on a carrier 105. In one implementation, a plurality of RDLs 112 and a plurality of dielectric layers 114 may be alternately formed on top of one another on the carrier 105 as shown in FIG. 5. In some embodiments, the RDLs 112 may include one or more of copper, titanium, aluminum, nickel, gold, alloys and/or combinations thereof, and/or other materials. The RDLs 112 may be vertically interconnected and may include various conductive pads, conductive lines, and/or conductive vias.

Then, a protective layer 113 may be formed on the topmost RDL 112. For example, the protective layer 113 may be a solder resist material or a low-temperature polyimide deposited and etched back to expose a portion of the topmost RDL 112. The protective layer 113 may be blanket formed and patterned to form openings, in which under bump metallization (UBM) structures 115 are formed. The protective layer 113 may be formed of nitrides, oxides, polyimide, low-temp polyimide, solder resist, and/or the like. The openings in the protective layer 113 may be formed using photo-lithography techniques such that the openings expose portions of the topmost RDL 112. The UBM structures 115 are formed of one or more layers of conductive materials and provide an electrical connection between the topmost RDL 112 and the connectors 180 to be formed in subsequent process. The UBM structures 115 may be formed, for example, of one or more layers of chrome, a chrome-copper alloy, copper, gold, titanium, titanium tungsten, nickel, combinations thereof, or the like. It should be noted that the protective layer 113 may act as a stress buffer layer to reduce the amount of stress in the electrical connections.

Figure 8:
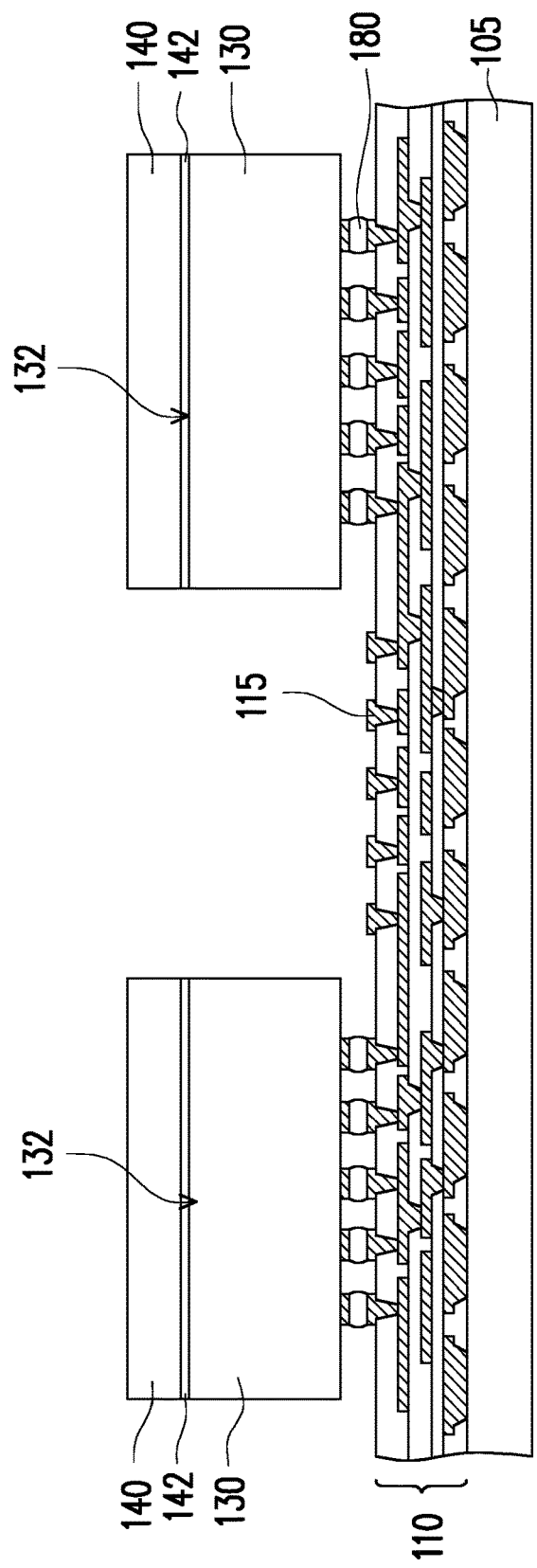

Referring to FIG. 8, the second semiconductor devices 130 may be bonded (e.g. flip chip bonded) to the redistribution structure 110 by a plurality of connectors 180, e.g., ball grid array (BGA) balls, controlled collapse chip connector (C4) bumps, microbumps, solder joints or the like. In some embodiments, the second semiconductor devices 130 may be a DRAM CSP. However, in other embodiments, the second semiconductor devices 130 could be any type of integrated circuit, such as a processor, logic circuitry, memory, analog circuit, digital circuit, mixed signal, and the like.

Then, at least one warpage adjusting component 140 is disposed on at least one of the second semiconductor devices 130. In some embodiments, multiple warpage adjusting components 140 are disposed on the second semiconductor devices 130 respectively, but the disclosure is not limited thereto. In one of the implementations, the warpage adjusting components 140 may be attached to the back surfaces 132 of the corresponding second semiconductor devices 130 via die attach films, or any other suitable adhesive. In some embodiments, the warpage adjusting components 140 may be attached to the second semiconductor devices 130 first, and the second semiconductor devices 130 are then bonded to the redistribution structure 110.

Figure 9:
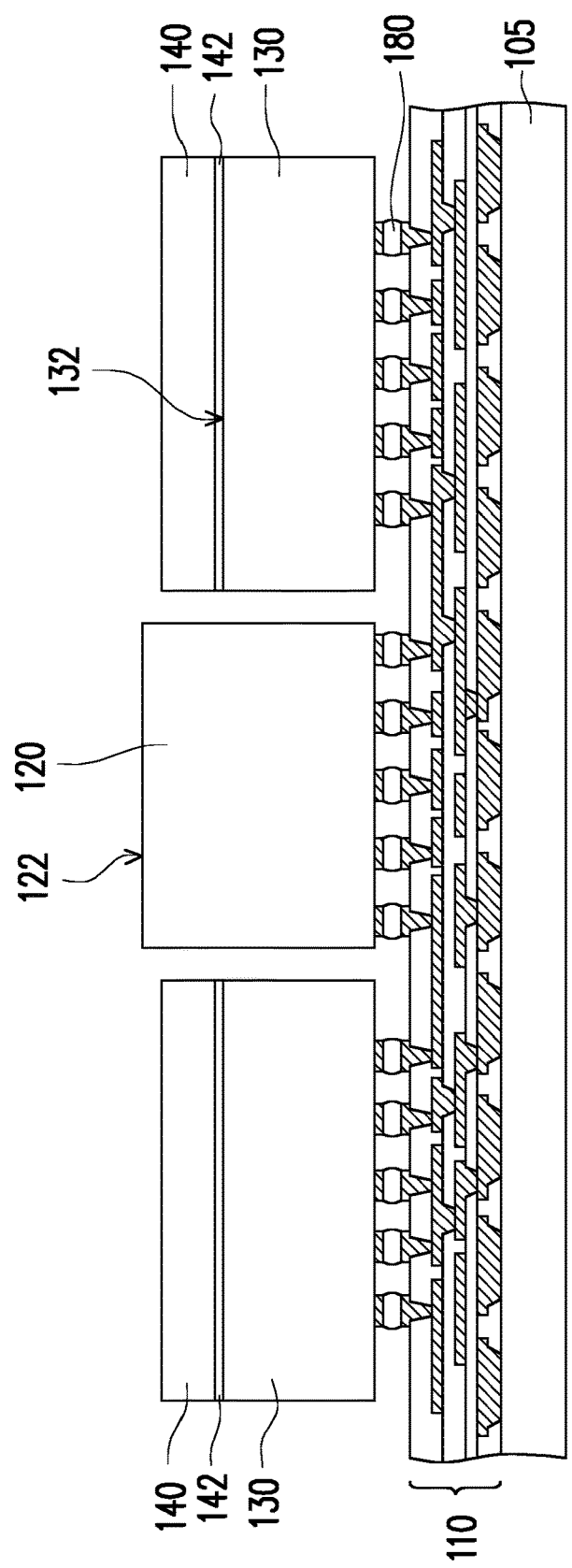

Referring to FIG. 9, the first semiconductor device 120 may be bonded (e.g. flip chip bonded) to the redistribution structure 110 by connectors 180, e.g., ball grid array (BGA) balls, controlled collapse chip connector bumps, microbumps, solder joints or the like. In some embodiments, the first semiconductor device 120 may be a SOC. However, in other embodiments, the first semiconductor device 120 could be any type of integrated circuit, such as a processor, logic circuitry, memory, analog circuit, digital circuit, mixed signal, and the like. In some embodiments, the first semiconductor device 120 is disposed on the redistribution structure 110 after the second semiconductor devices 120 are. Alternatively, the first semiconductor device 120 may also be disposed on the redistribution structure 110 before the second semiconductor devices 120 are. The disposition orders of the first semiconductor device 120, the second semiconductor devices 120 and the warpage adjusting components 140.

Figure 10:
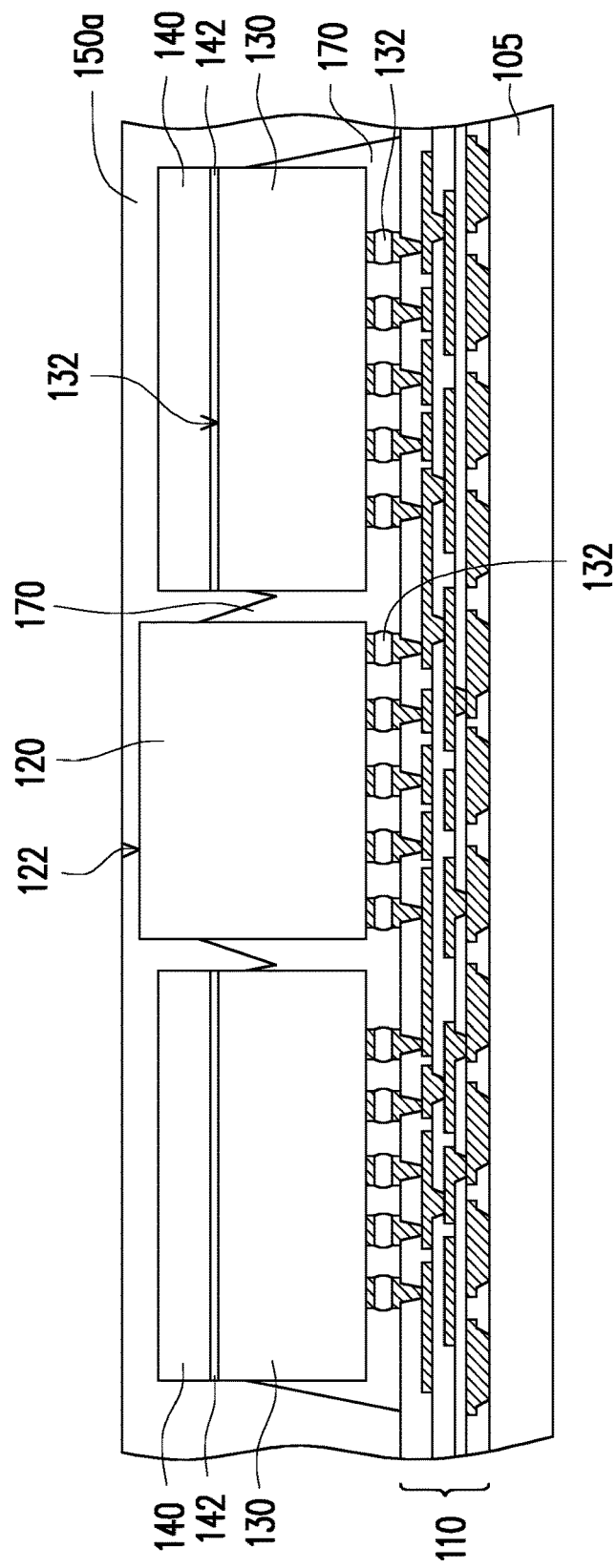

Referring to FIG. 10, an underfill 170 may be formed to fill between the first semiconductor device 120 and the redistribution structure 110 and fill between the second semiconductor devices 130 and redistribution structure 110. In some embodiments, the underfill 170 may be dispensed around the connectors 180 as illustrated by FIG. 10. The underfill 170 may be included to provide structural support and protection to the connectors 180. Then, an encapsulating material 150a is formed on the redistribution structure 110 to encapsulate the first semiconductor device 120, the second semiconductor devices 130 and the warpage adjusting components 140. In some embodiments, the encapsulating material 150a may be a molding compound including polymer material (e.g., epoxy, resin, and the like) either with or without hardeners, fillers (e.g., silica filler, glass filler, aluminum oxide, silicon oxide, and the like), adhesion promoters, combinations thereof, and the like.

Figure 11:
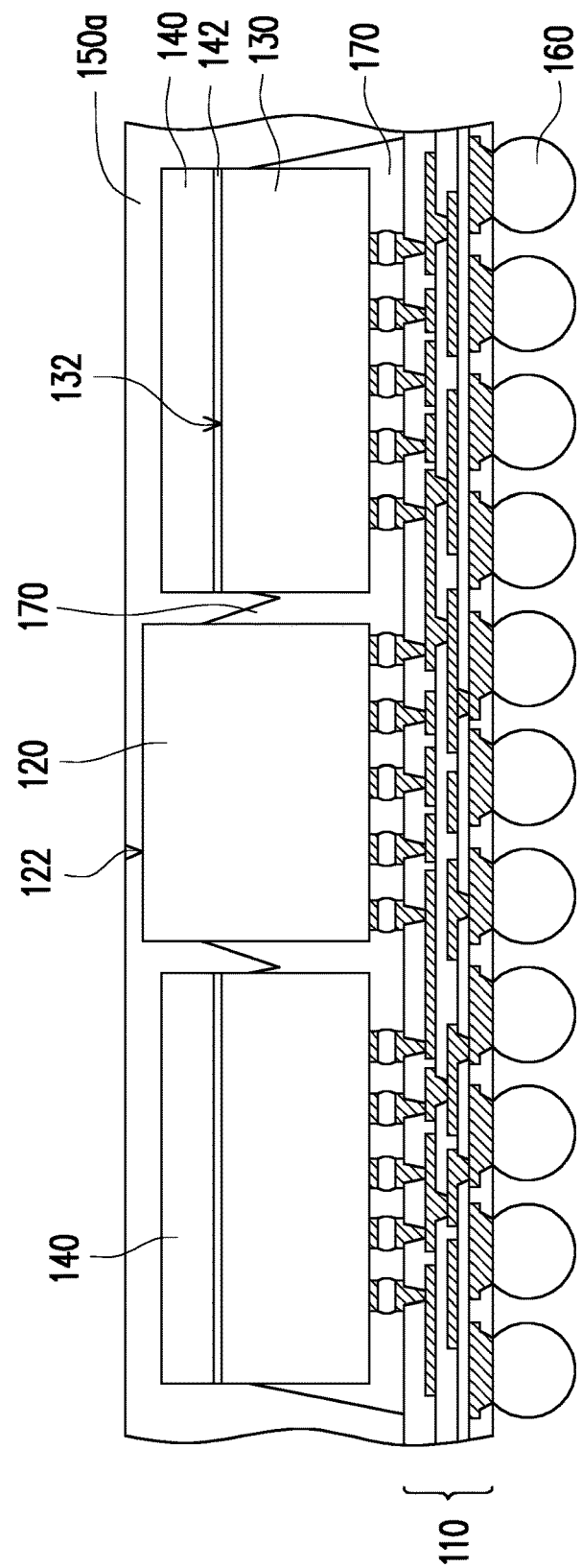

Then, referring to FIG. 10 and FIG. 11, the carrier 105 may be removed to reveal a bottom surface of the redistribution structure 110. In some embodiments, the carrier 105 is detached from the redistribution structure 110 by causing an adhesive layer on the carrier 105 to lose or reduce adhesion. The adhesive layer is then removed along with the carrier 105. For example, the adhesive layer on the carrier 105 may be exposed to UV light, so that the adhesive layer loses or reduces adhesion, and hence the carrier 105 can be removed from the redistribution structure 110. After the carrier 105 is removed, a plurality of electrical terminals 160 may be formed on the bottom surface of the redistribution structure 110 to be electrically connected to the RDLs of the redistribution structure 110.

In addition, a grinding process may be performed to grind the encapsulating material 150a (and maybe some of the first semiconductor device 120) until the back surface 122 of the first semiconductor device 120 is revealed, so the semiconductor device package 100 as shown in FIG. 1 can be obtained. In such embodiment, the ground top surface of the encapsulating material 150 is substantially coplanar with the back surface 122 of the first semiconductor device 120. In some embodiments, a grinding process may be performed until both the first semiconductor device 120 and the warpage adjusting components 140 are revealed. Alternatively, in some embodiments, the grinding process may be omitted.

FIG. 12 to FIG. 16 illustrate cross sectional views of intermediate stages in the manufacturing of a semiconductor device package according to some exemplary embodiments of the present disclosure. It is noted that the semiconductor device package 200 shown in FIG. 16 contains many features same as or similar to the semiconductor device packages 100, 100a, 100b disclosed earlier with FIG. 1 to FIG. 4. In addition, the manufacturing process of the semiconductor device package 200 shown in FIG. 12 to FIG. 16 contains many features same as or similar to manufacturing process of the semiconductor device package disclosed earlier with FIG. 5 to FIG. 11. For purpose of clarity and simplicity, detail description of same or similar features may be omitted, and similar reference numbers denote the same or like components. The main differences between the embodiments shown in FIG. 12 to FIG. 16 and the embodiments shown in FIG. 1 to FIG. 11 are described as follows.

Figure 12:
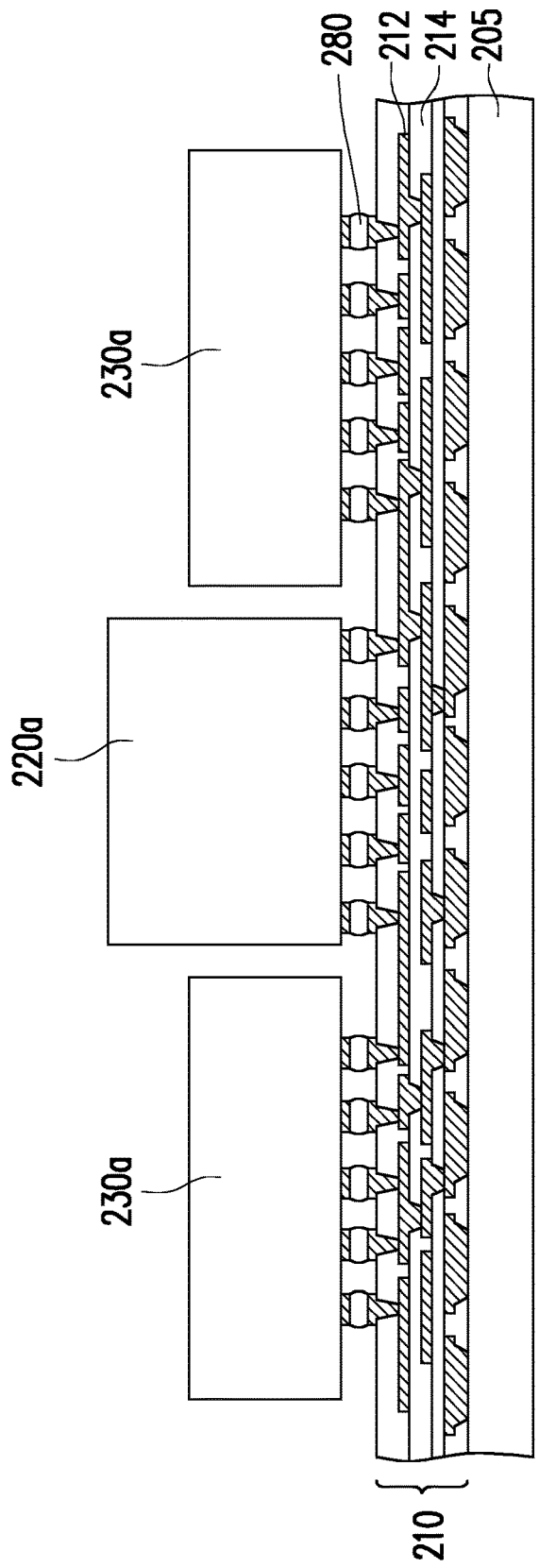
FIG. 12 to FIG. 16 illustrate cross sectional views of intermediate stages in the manufacturing of a semiconductor device package according to some exemplary embodiments of the present disclosure.

Referring to FIG. 12, a first semiconductor device 220a and a plurality of second semiconductor devices 230a are disposed on a redistribution structure 210 provided on a carrier 205. In some embodiments, the first semiconductor device 220a and the second semiconductor devices 230a may be bonded to the redistribution structure 210 through a plurality of connectors 280 such as solder joints. In some implementations, the first semiconductor device 220a and the second semiconductor devices 230a may be different type of semiconductor devices with different sizes. For example, the first semiconductor device 220a may be a SOC, while each of the second semiconductor devices 230a may be a DRAM CSP. In one implementation, the second semiconductor devices 230a may surround the first semiconductor device 220a and be electrically connected to the first semiconductor device 220a through the redistribution structure 210. In some embodiments, the redistribution structure 210 is a fan-out redistribution structure 210 including a plurality of fan-out redistribution lines (RDLs) 212 and a plurality of dielectric layers 214 stacked alternately on top of one another. Alternatively, in other embodiments, the redistribution structure may be a package substrate, which includes conductive circuits and conductive vias that are used to route electrical signals between opposite sides of the substrate. The disclosure does not limit formation of the redistribution structure 210.

Figure 13:
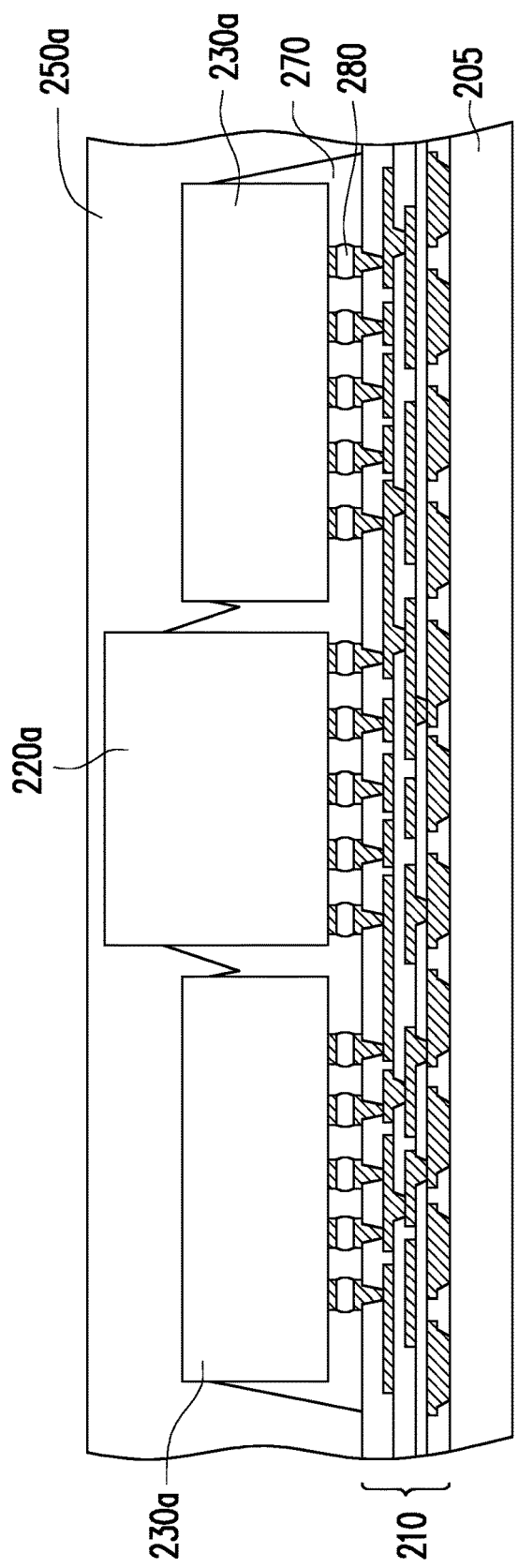

Referring to FIG. 13, an underfill 270 may be formed to fill between the first semiconductor device 220a and the redistribution structure 210 and fill between the second semiconductor devices 230a and redistribution structure 210. In some embodiments, the underfill 270 may be dispensed around the connectors 280 as illustrated by FIG. 13. The underfill 270 may be included to provide structural support and protection to the connectors 280. Then, an encapsulating material 250a is formed on the redistribution structure 210 to encapsulate the first semiconductor device 220a and the second semiconductor devices 230a without disposing any warpage adjusting components on the back surface of the second semiconductor devices 230a first. In some embodiments, the encapsulating material 250a may be a molding compound including polymer material (e.g., epoxy, resin, and the like) either with or without hardeners, fillers (e.g., silica filler, glass filler, aluminum oxide, silicon oxide, and the like), adhesion promoters, combinations thereof, and the like.

Figure 14:
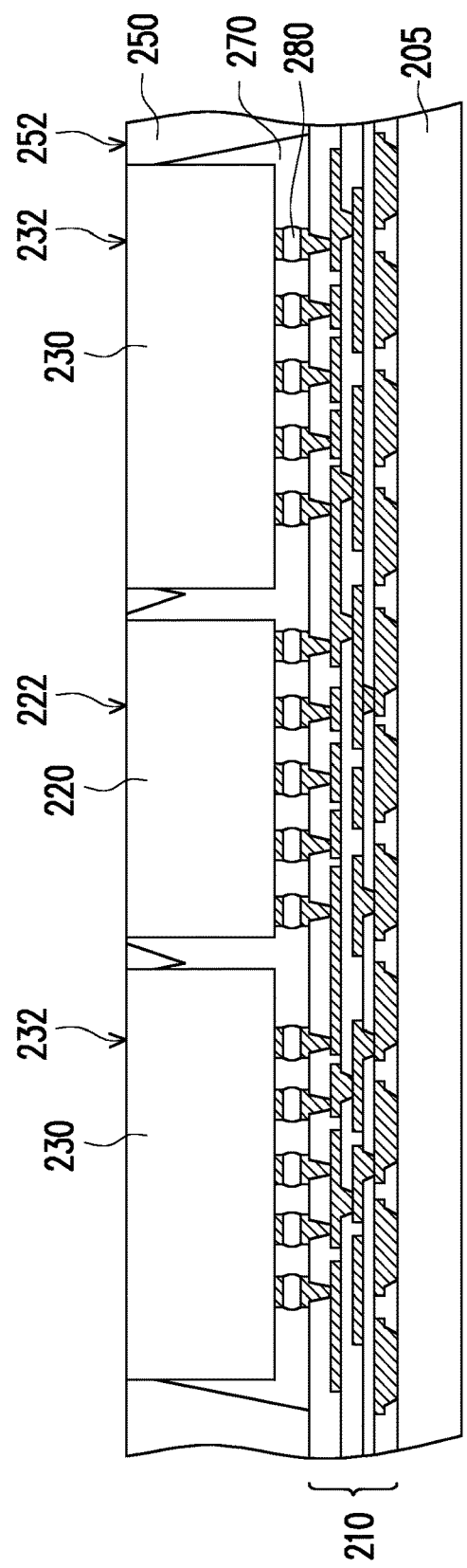

Then, referring to FIG. 14, a grinding process may be optionally performed until a back surface 222 of the first semiconductor device 220 and back surfaces 232 of the second semiconductor devices 230 are revealed. Namely, the top surface 252 of the encapsulating material 250, the back surface 222 of the first semiconductor device 220 and the back surfaces of the second semiconductor devices 230 are coplanar with one another. In some embodiments, the grinding process may be performed until the first semiconductor device 220 is revealed while the second semiconductor devices 230a are still encapsulated in the encapsulating material 250. In some embodiments, the grinding process may be performed until both the first semiconductor device 220 and the second semiconductor devices 230 are revealed. Alternatively, in some embodiments, the grinding process may be omitted. Throughout the description, the resultant structure including the first semiconductor device 220, the second semiconductor 230 and the encapsulating material 250 as shown in FIG. 15 is referred to as encapsulated package 255.

Figure 17:
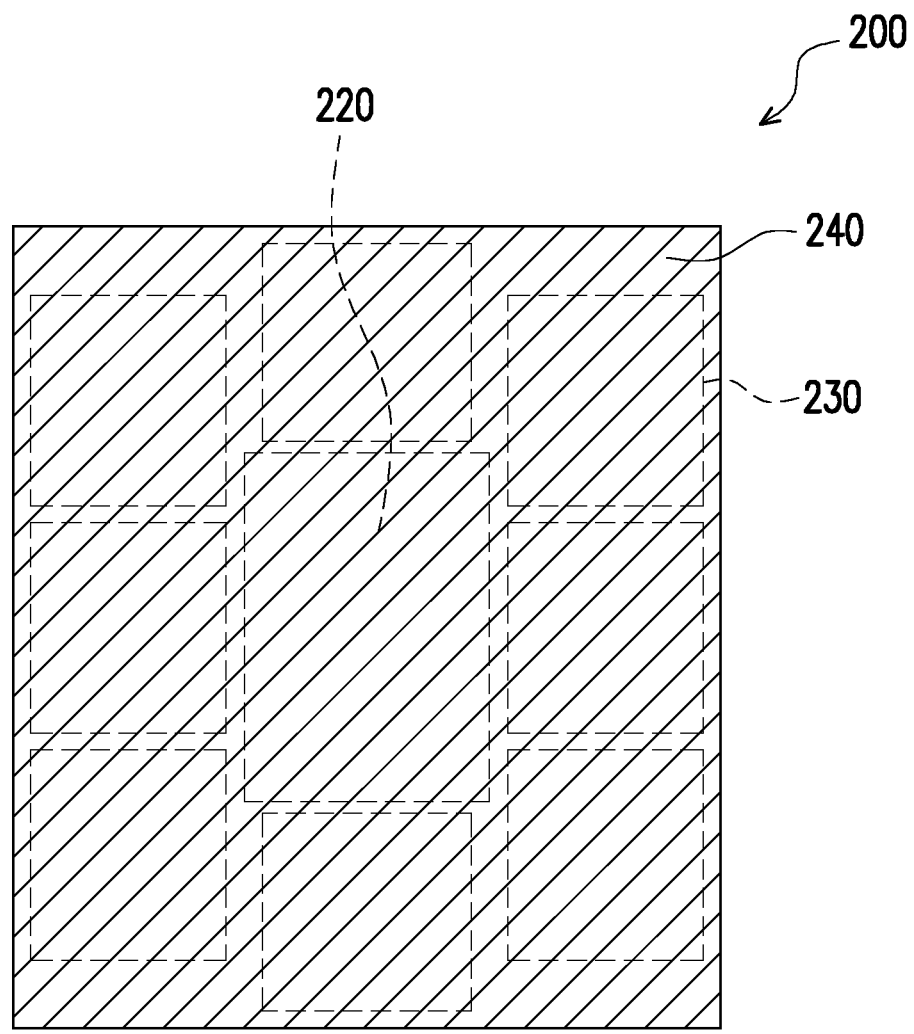
FIG. 17 illustrates a top view of a semiconductor device package according to some exemplary embodiments of the present disclosure.

FIG. 17 illustrates a top view of a semiconductor device package according to some exemplary embodiments of the present disclosure. Referring to FIG. 15 and FIG. 17, a warpage adjusting frame 240 is disposed on the encapsulated package 255. In some embodiments, the warpage adjusting frame 240 is disposed on the encapsulating material 250 and is at least partially superimposed with the second semiconductor devices 230. In some embodiments, the warpage adjusting frame 240 is in a lid (or plate) form as shown in FIG. 15 and FIG. 17. Accordingly, in the embodiments in which the grinding process is applied, the warpage adjusting frame 240 may be in contact with the top surface 252 of the encapsulating material 250, the back surface 222 of the first semiconductor device 220 and the back surfaces 232 of the second semiconductor devices 230 as shown in FIG. 15.

In some embodiments, an adhesive 242 may be used to attach the warpage adjusting frame 240 to the package. For example, the adhesive may include thermal interface material (TIM) adhesive tape or any other suitable adhesive. The warpage adjusting frame 240 may be attached to further reduce warpage in semiconductor device package 200. For example, the material of the warpage adjusting frame 240 may include metal (e.g. stainless steel, copper, aluminum, wolfram, etc.) or any other suitably rigid material, which further increases the rigidity of the semiconductor device package 200. In some embodiments, the thickness of the warpage adjusting frame 240 may be substantially greater than 200 μm. Furthermore, when the warpage adjusting frame 240 includes a metal, which have a CTE higher than the CTE of the silicon in the semiconductor devices 220, 230, the CTE mismatch in the semiconductor device package 200 is decreased, so the warpage of the semiconductor device package 200 can be further reduced. In addition, by disposing the warpage adjusting frame 240 on top of the encapsulated package 255, the warpage profile of the semiconductor device package 200 can be improved, so there is no need to spare extra space on the redistribution structure for disposing a retaining ring thereon. Thereby, the size of the semiconductor device package 200 can be reduced.

Figure 15:
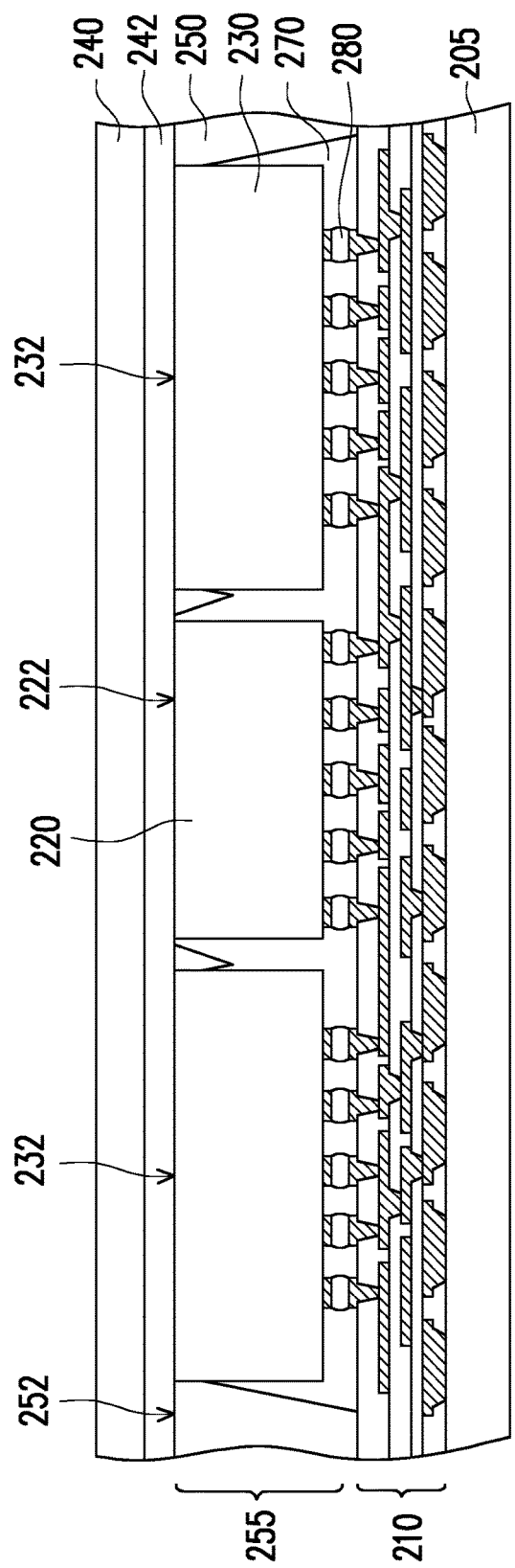
Figure 16:
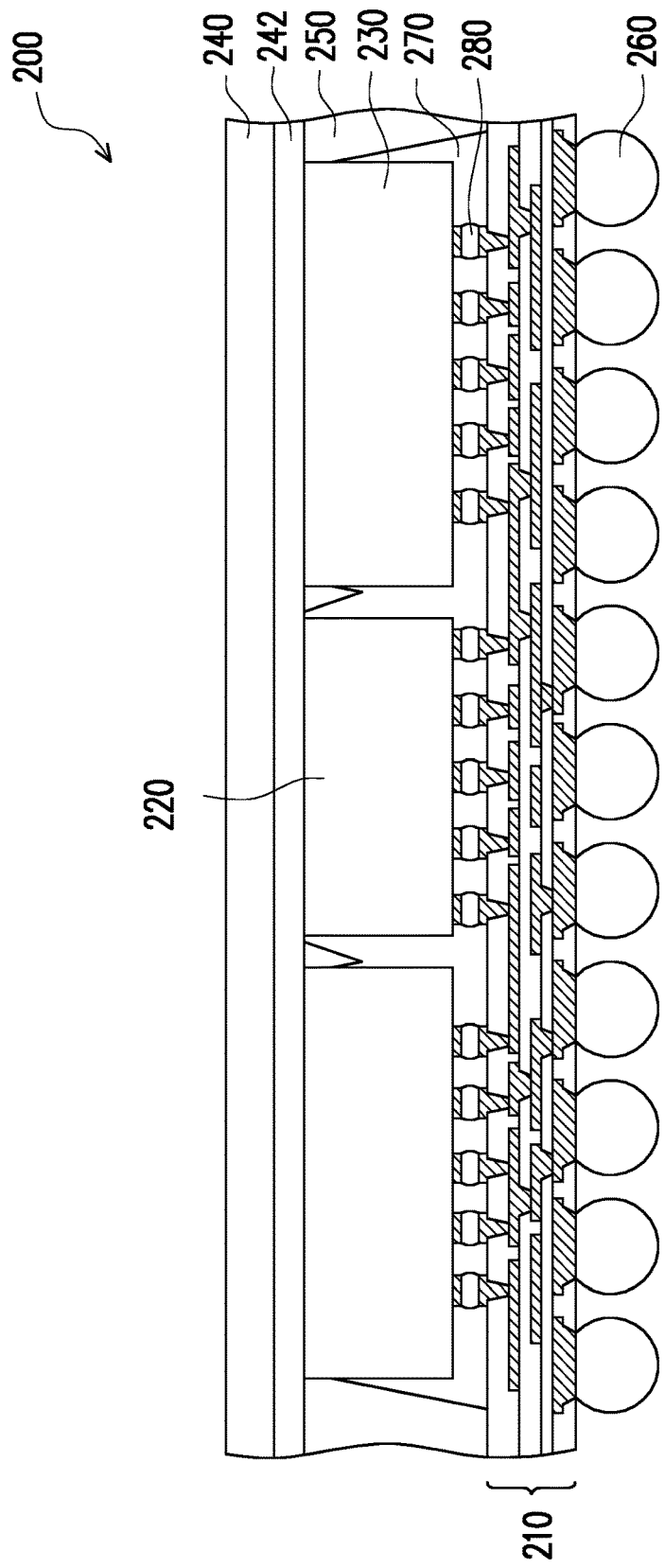

Then, referring to FIG. 15 and FIG. 16, the carrier 205 may be removed to reveal a bottom surface of the redistribution structure 210. In some embodiments, the carrier 105 is detached from the redistribution structure 110 by causing an adhesive layer on the carrier 105 to lose or reduce adhesion. After the carrier 205 is removed, a plurality of electrical terminals 260 may be formed on the bottom surface of the redistribution structure 210 to be electrically connected to the RDLs of the redistribution structure 210, so the semiconductor device package 200 as shown in FIG. 16 can be obtained.

Figure 18:
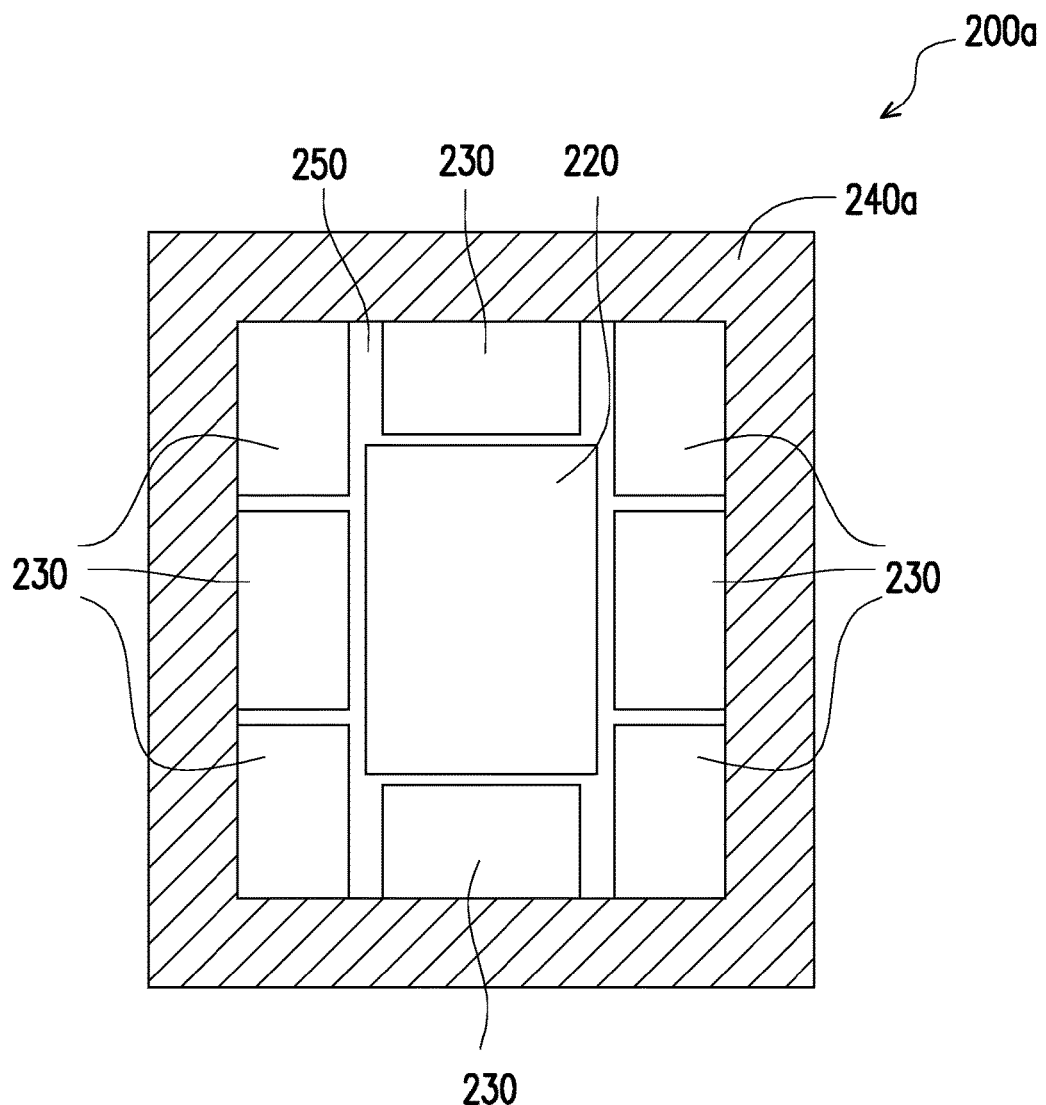
FIG. 18 illustrates a top view of a semiconductor device package according to some exemplary embodiments of the present disclosure.
Figure 19:
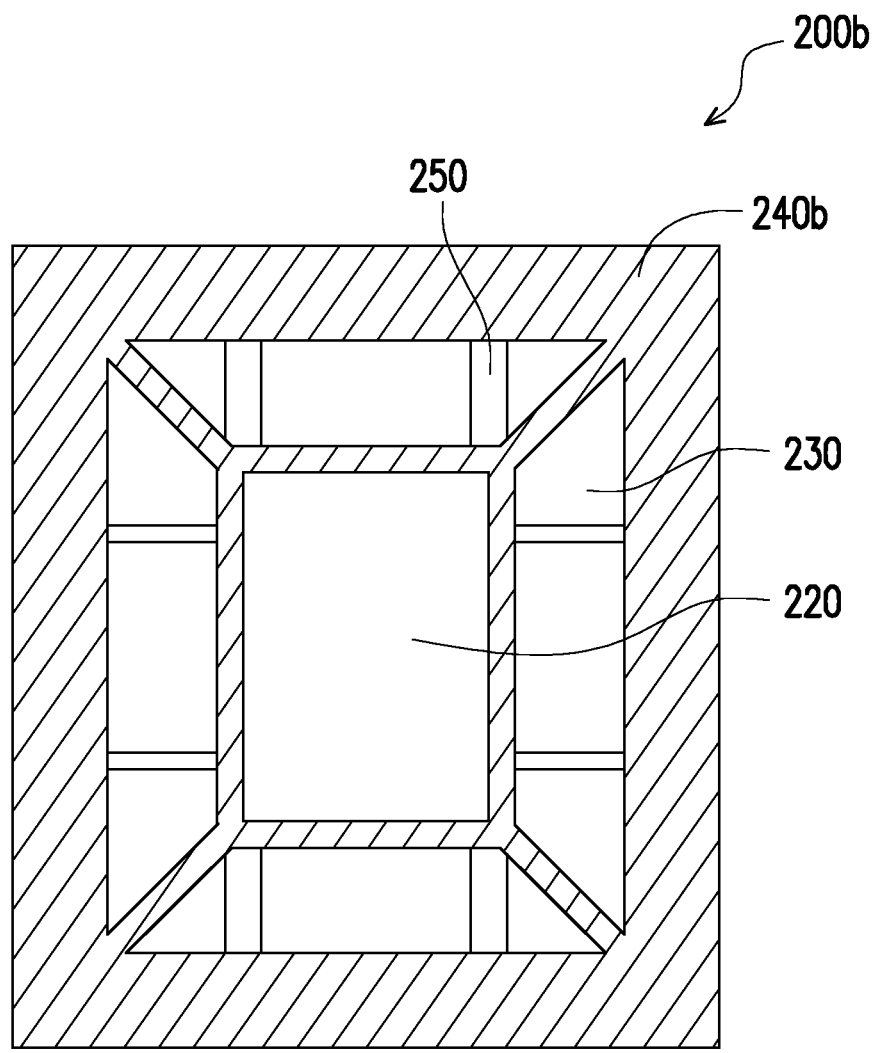
FIG. 19 illustrates a top view of a semiconductor device package according to some exemplary embodiments of the present disclosure.

FIG. 18 illustrates a top view of a semiconductor device package according to some exemplary embodiments of the present disclosure. FIG. 19 illustrates a top view of a semiconductor device package according to some exemplary embodiments of the present disclosure. It is noted that the semiconductor device packages 200a, 200b shown in FIG. 18 and FIG. 19 contains many features same as or similar to the semiconductor device package 200 disclosed earlier with FIG. 16 to FIG. 17. For purpose of clarity and simplicity, detail description of same or similar features may be omitted, and similar reference numbers denote the same or like components. The main differences between the semiconductor device packages 200a, 200b shown in FIG. 18 and FIG. 19 and the semiconductor device package 200 disclosed earlier with FIG. 16 to FIG. 17 are described as follows.

In some embodiments, other than being in a lid form to comprehensively cover the encapsulating material 250, the first semiconductor device 220 and the second semiconductor devices 230, the warpage adjusting frames 240a, 240b may also be in a ring form to partially cover the encapsulating material 250, the first semiconductor device 220 and the second semiconductor devices 230. In some embodiments, the warpage adjusting frames 240a, 240b may be in contact with the encapsulating material 250 and the back surfaces of the second semiconductor devices 230, and the warpage adjusting frames 240a, 240b may reveal the back surface of the first semiconductor device 220. Referring to FIG. 18, the warpage adjusting frames 240a is arranged on top of a peripheral region of the package, so that the warpage adjusting frame 240a is in contact with the encapsulating material 250 and a part of the back surfaces of the second semiconductor devices 230. In such embodiment, the warpage adjusting frames 240a may reveal the entire back surface of the first semiconductor device 220. Referring to FIG. 19, the warpage adjusting frame 240b is in a ring shape with designed pattern, so that the warpage adjusting frame 240b is in contact with the encapsulating material 250 and a part of the back surfaces of the second semiconductor devices 230. In such embodiment, the warpage adjusting frame 240b may reveal the entire back surface of the first semiconductor device 220 or partially cover the back surface of the first semiconductor device 220. The formations of the warpage adjusting frames 240, 240a, and 240b may be adjusted according to the warpage profile of the semiconductor device packages 200, 200a, and 200b.

In accordance with some embodiments of the disclosure, a semiconductor device package includes a redistribution structure, a first semiconductor device, a plurality of second semiconductor devices, at least one warpage adjusting component, and an encapsulating material. The first semiconductor device is disposed on the redistribution structure. The second semiconductor devices are disposed on the redistribution structure and surround the first semiconductor device. The at least one warpage adjusting component is disposed on at least one of the second semiconductor devices. The encapsulating material encapsulates the first semiconductor device, the second semiconductor devices and the warpage adjusting component, wherein a Young's modulus of the warpage adjusting component is greater than or equal to a Young's modulus of the encapsulating material, and a coefficient of thermal expansion (CTE) of the warpage adjusting component is smaller than a CTE of the encapsulating material.

In accordance with some embodiments of the disclosure, the redistribution structure is a fan-out redistribution structure comprising a plurality of redistribution lines (RDLs) and a plurality of dielectric layers stacked alternately on top of one another, and the encapsulating material is extended over the redistribution structure.

In accordance with some embodiments of the disclosure, wherein the redistribution structure is a package substrate.

In accordance with some embodiments of the disclosure, wherein the first semiconductor device is a system on chip (SOC), and each of the second semiconductor devices is a dynamic random access memory (DRAM) chip-scale package (CSP).

In accordance with some embodiments of the disclosure, wherein the at least one warpage adjusting component is attached to a back surface of the at least one of the second semiconductor devices via a die attach film, and the back surface faces away from the redistribution structure.

In accordance with some embodiments of the disclosure, wherein the number of the at least one warpage adjusting component is plural, and the warpage adjusting components are disposed on at least a set of the second semiconductor devices respectively.

In accordance with some embodiments of the disclosure, wherein sizes of the warpage adjusting components are substantially the same.

In accordance with some embodiments of the disclosure, wherein a size of one of the warpage adjusting components is different from a size of another one of the warpage adjusting components.

In accordance with some embodiments of the disclosure, wherein a thickness of the first semiconductor device is greater than a thickness of each of the second semiconductor devices, and the encapsulating material reveals a back surface of the first semiconductor device.

In accordance with some embodiments of the disclosure, a method of forming a semiconductor device package comprising: forming a redistribution structure on a carrier; disposing a plurality of second semiconductor devices on the redistribution structure; disposing at least one warpage adjusting component on at least one of the second semiconductor devices; disposing a first semiconductor device on the redistribution structure; forming an encapsulating material on the redistribution structure to encapsulate the first semiconductor device, the second semiconductor devices and the warpage adjusting component; removing the carrier to reveal a bottom surface of the redistribution structure; and forming a plurality of electrical terminals on the bottom surface of the redistribution structure.

In accordance with some embodiments of the disclosure, wherein a Young's modulus of the warpage adjusting component is greater than or equal to a Young's modulus of the encapsulating material, and a coefficient of thermal expansion (CTE) of the warpage adjusting component is smaller than a CTE of the encapsulating material.

In accordance with some embodiments of the disclosure, wherein the first semiconductor device is a system on chip (SOC), each of the second semiconductor devices is a dynamic random access memory (DRAM) chip-scale package (CSP), and the second semiconductor devices surround the first semiconductor device.

In accordance with some embodiments of the disclosure, wherein disposing the at least one warpage adjusting component on the at least one of the second semiconductor devices comprises: attaching the at least one warpage adjusting component to a back surface of the at least one of the second semiconductor devices, wherein the back surface faces away from the redistribution structure.

In accordance with some embodiments of the disclosure, wherein the number of the at least one warpage adjusting component is plural, and the warpage adjusting components are disposed on at least a set of the second semiconductor devices respectively.

In accordance with some embodiments of the disclosure, the method further comprises: forming an underfill to fill between the first semiconductor device and the redistribution structure and fill between the second semiconductor devices and redistribution structure before the encapsulating material is formed.

In accordance with some embodiments of the disclosure, a semiconductor device package comprises a redistribution structure, a first semiconductor device, a first semiconductor device, an encapsulating material and a warpage adjusting frame. The first semiconductor device is disposed on the redistribution structure. The second semiconductor devices are disposed on the redistribution structure and surround the first semiconductor device. The encapsulating material encapsulates the first semiconductor device and the second semiconductor devices. The warpage adjusting frame is disposed on the encapsulating material and superimposed with the second semiconductor devices.

In accordance with some embodiments of the disclosure, wherein the material of the warpage adjusting frame comprises stainless steel, copper, aluminum or wolfram.

In accordance with some embodiments of the disclosure, wherein encapsulating material reveals a back surface of the first semiconductor device and back surfaces of the second semiconductor devices, and a top surface of the encapsulating material is coplanar with the back surface of the first semiconductor device and the back surfaces of the second semiconductor devices.

In accordance with some embodiments of the disclosure, wherein and the warpage adjusting frame is in a ring form, which is in contact with the encapsulating material and the back surfaces of the second semiconductor devices and reveals the back surface of the first semiconductor device.

In accordance with some embodiments of the disclosure, wherein the warpage adjusting frame is in a lid form, which is in contact with the encapsulating material, the back surface of the first semiconductor device and the back surfaces of the second semiconductor devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device package comprising:
   forming a redistribution structure on a carrier;
   disposing a plurality of second semiconductor devices on the redistribution structure;
   disposing at least one warpage adjusting component on at least one of the second semiconductor devices;
   disposing a first semiconductor device on the redistribution structure;
   forming an encapsulating material on the redistribution structure to encapsulate the first semiconductor device, the second semiconductor devices and the warpage adjusting component;
   removing the carrier to reveal a bottom surface of the redistribution structure; and
   forming a plurality of electrical terminals on the bottom surface of the redistribution structure.

2. The method as claimed in claim 1, wherein a Young's modulus of the warpage adjusting component is greater than or equal to a Young's modulus of the encapsulating material, and a coefficient of thermal expansion (CTE) of the warpage adjusting component is smaller than a CTE of the encapsulating material.

3. The method as claimed in claim 1, wherein the first semiconductor device is a system on chip (SOC), each of the second semiconductor devices is a dynamic random access memory (DRAM) chip-scale package (CSP), and the second semiconductor devices surround the first semiconductor device.

4. The method as claimed in claim 1, wherein disposing the at least one warpage adjusting component on the at least one of the second semiconductor devices comprises:
   attaching the at least one warpage adjusting component to a back surface of the at least one of the second semiconductor devices, wherein the back surface faces away from the redistribution structure.

5. The method as claimed in claim 1, wherein the number of the at least one warpage adjusting component is plural, and the warpage adjusting components are disposed on at least a set of the second semiconductor devices respectively.

6. The method as claimed in claim 1, further comprising:
   forming an underfill to fill between the first semiconductor device and the redistribution structure and fill between the second semiconductor devices and redistribution structure before the encapsulating material is formed.

7. The method as claimed in claim 1, wherein the first semiconductor device and the plurality of second semiconductor devices are disposed on the redistribution structure through a plurality of connectors.

8. The method as claimed in claim 1, wherein a thickness of the first semiconductor device is substantially greater than a thickness of each of the plurality of second semiconductor devices, the encapsulating material reveals a back surface of the first semiconductor device and covers back surfaces of the plurality of second semiconductor devices.

9. A method of forming a semiconductor device package comprising:
   forming a redistribution structure on a carrier;
   disposing a plurality of second semiconductor devices on the redistribution structure;
   disposing a first semiconductor device on the redistribution structure;
   forming an encapsulating material on the redistribution structure to encapsulate the first semiconductor device and the second semiconductor devices;
   disposing at least one warpage adjusting component over the encapsulating material and at least one of the second semiconductor devices;
   removing the carrier to reveal a bottom surface of the redistribution structure; and
   forming a plurality of electrical terminals on the bottom surface of the redistribution structure.

10. The method as claimed in claim 9, further comprising:
    performing a grinding process on the encapsulating material, such that a top surface of the encapsulating material is coplanar with the back surface of the first semiconductor device and the back surfaces of the second semiconductor devices.

11. The method as claimed in claim 9, wherein the at least one warpage adjusting component is in contact with a top surface of the encapsulating material, a back surface of the first semiconductor device and back surfaces of the second semiconductor devices.

12. The method as claimed in claim 9, wherein the at least one warpage adjusting frame is in a ring form, which is in contact with a top surface of the encapsulating material and back surfaces of the second semiconductor devices and reveals a back surface of the first semiconductor device.

13. The method as claimed in claim 9, wherein the material of the at least one warpage adjusting frame comprises stainless steel, copper, aluminum or wolfram.

14. The method as claimed in claim 9, wherein the first semiconductor device is a system on chip (SOC), each of the second semiconductor devices is a dynamic random access memory (DRAM) chip-scale package (CSP), and the second semiconductor devices surround the first semiconductor device.

15. The method as claimed in claim 9, wherein disposing the at least one warpage adjusting component over the encapsulating material and the at least one of the second semiconductor devices comprises:
    attaching the at least one warpage adjusting component to a top surface of the encapsulating material and the back surface of the at least one of the second semiconductor devices by an adhesive, wherein the back surface faces away from the redistribution structure.

16. A method of forming a semiconductor device package comprising:
    forming a redistribution structure;
    disposing a plurality of second semiconductor devices on the redistribution structure;
    disposing at least one warpage adjusting component on at least one of the second semiconductor devices;
    disposing a first semiconductor device on the redistribution structure; and
    forming an encapsulating material on the redistribution structure to encapsulate the first semiconductor device, the second semiconductor devices and the warpage adjusting component.

17. The method as claimed in claim 16, wherein a Young's modulus of the warpage adjusting component is greater than or equal to a Young's modulus of the encapsulating material, and a coefficient of thermal expansion (CTE) of the warpage adjusting component is smaller than a CTE of the encapsulating material.

18. The method as claimed in claim 16, further comprising:
    forming a plurality of electrical terminals on a bottom surface of the redistribution structure.

19. The method as claimed in claim 16, wherein disposing the at least one warpage adjusting component on the at least one of the second semiconductor devices comprises:
    attaching the at least one warpage adjusting component to a back surface of the at least one of the second semiconductor devices, wherein the back surface faces away from the redistribution structure.

20. The method as claimed in claim 16, wherein the number of the at least one warpage adjusting component is plural, and the warpage adjusting components are disposed on at least a set of the second semiconductor devices respectively.

* * * * *